United States Patent [19]
Tong

[11] Patent Number: 5,095,207
[45] Date of Patent: Mar. 10, 1992

[54] METHOD OF THREE-DIMENSIONAL ATOMIC IMAGING

[75] Inventor: David S. Y. Tong, Fox Point, Wis.

[73] Assignee: University of Wisconsin - Milwaukee, Milwaukee, Wis.

[21] Appl. No.: 638,351

[22] Filed: Jan. 7, 1991

[51] Int. Cl.⁵ .............................................. H01J 37/26
[52] U.S. Cl. .................................... 250/306; 250/307
[58] Field of Search ........................ 250/306, 307, 397

[56] References Cited

U.S. PATENT DOCUMENTS

| | | | |
|---|---|---|---|
| 4,038,543 | 7/1977 | Krisch et al. | 250/307 |
| 4,109,996 | 8/1978 | Ersoy | 250/306 |
| 4,532,422 | 7/1985 | Nomura et al. | 250/306 |
| 4,935,625 | 6/1990 | Hasegawa et al. | 250/306 |
| 4,998,788 | 3/1991 | Osahaba et al. | 250/306 |

OTHER PUBLICATIONS

"Photoelectron Holography", Barton, *Phy. Rev. Letters*, vol. 61, No. 12, Sep. 1988, p. 1356-1359.

*Primary Examiner*—Bruce C. Anderson
*Attorney, Agent, or Firm*—Foley & Lardner

[57] ABSTRACT

A method of three-dimensional imaging of the atomic environment of atoms near the surface of the sample involves forming a localized source electron diffraction pattern, detecting the intensity of the distribution of the pattern, and generating data corresponding to the intensity distribution. The intensity data is normalized and corrected for a phase shift error to produce data corresponding to a hologram. The process may be repeated at a several predetermined emitted electron energies, and the data at each energy is combined to yield a composite image intensity having improved resolution. The method of the invention can provide a lenseless electron microscope having a resolution better than one angstrom and which overcomes distortions caused by multiple scattering.

14 Claims, 8 Drawing Sheets

METHOD OF THREE-DIMENSIONAL ATOMIC IMAGING

FIELD OF THE INVENTION

This invention pertains generally to a method and apparatus for surface structure determination, particularly to a method and apparatus for surface structure determination from localized electron sources.

BACKGROUND OF THE INVENTION

The information pertaining to the relative positions of atoms near the surface of a sample is important in understanding the chemical and physical properties of surface structure. Techniques of gathering information concerning surface structure include localized source electron diffraction, such as photoelectron, Auger, and Kikuchi diffraction, low energy electron diffraction (LEED) and diffuse LEED (DLEED). A localized source electron is an electron that either appears to, or actually does, originate near an atomic nucleus within the sample.

In order to obtain three dimensional information regarding lattice structure it has been suggested to use holograms and holographic techniques (the creation of a three dimensional image from an interference pattern). A hologram is a record of an interference pattern, which, when properly processed, forms a three dimensional image of the object originally used to create the interference pattern. Thus, assuming that it is possible to create a practical process of reproducing the image, a hologram of a surface may be used to determine the relative positions of the atoms near the surface of the sample.

The use of localized-source electron holography to gather information concerning surface structure promises to be a great advance in the art. It has been suggested, for example, that, an electron hologram can be created by recording the intensity of an interference pattern formed by electrons which are emitted from an atom in the sample, and travel to the film directly from this atom (the reference wave), or after scattering off of one or more nearby atoms in the sample (the object wave). Then, rather than physically illuminating the hologram with an electron beam to reconstruct the image, data corresponding to the reconstructed intensity is generated by multiplying the recorded interference data by a function representing the intensity of a reconstructing wave, i.e. "mathematically" illuminating the hologram to reconstruct a real image. The image intensity at points off the hologram, i.e. a reconstructed image, may then be appropriately determined via a computer using certain mathematical techniques. Such a method of holographic DLEED imaging is described in Saldin et al., *Phys. Rev. Lett.* 64:1270 (1990).

A further method of using holographic techniques to determine surface structure is set forth in *Photoelectron Holghraphy*, Vol. 61, No. 12, Phys. Rev. Letters, Sept. 19, 1988, by John Barton, which proposed to interpret photoelectron (PhD) data collected on a portion of a spherical surface centered about a crystal having adsorbed atoms as a photoelectron hologram. It was suggested that the photoelectron data may be normalized by subtracting from each intensity data point the intensity of the reference wave, and then dividing this difference by the square root of the intensity of the reference wave. Next, the normalized data, which corresponds to the intensity of a hologram, is then multiplied by a function representing a reconstructing wave, which is the conjugate of the reference wave, in this case a converging spherical wave. The resultant data corresponds to the transmitted intensity of an illuminating wave. The intensity at points off of the hologram (the spherical surface) is calculated using a mathematical technique called the Helmholtz-Kirchoff integral.

The Helmholtz-Kirchoff integral is a well known technique of determining the intensity of light in three dimensions given the intensity on a surface, and is particularly useful in PhD applications. According to the Helmholtz-Kirchoff integral, each point on the surface is treated as a point source of light, and a mathematical expression for the intensity in three dimensions due to each individual point source is determined. A mathematical expression for the total intensity in three dimensions is simply the sum of the amplitudes due to the point sources, and may be found by integrating the function representing the amplitudes due to the individual point sources over the surface (i.e. the point sources). The Helmholtz-Kirchoff integral, when applied to PhD holographic data, is in the form of a double Fourier integral, and may be solved numerically using a fast Fourier transform. A second method of reconstructing three-dimensional images from the normalized data is to apply three-dimensional Fourier transformation to the data. Three-dimensional images can also be formed from an interference pattern made up of a multitude of holograms. This is the case in spectroscopy X-ray photoemission, for example, when the sample orientation is rotated.

Known methods of three-dimensional atomic imaging suffer from poor resolution and accuracy. In particular, a resolution to 2-3 angstroms is insufficient when the atoms and bond lengths being observed are of comparable size. The present invention addresses these problems.

SUMMARY OF THE INVENTION

A method of three-dimensional imaging of the atomic environment of atoms near the surface of a sample according to the invention includes the initial step of forming a localized source electron diffraction pattern. The intensity of the distribution of the pattern is then detected, and data corresponding to the intensity distribution is generated. The intensity data is normalized and corrected for a phase shift error to produce data corresponding to a hologram. This phase-shift error, previously unrecognized, causes the images of scatterer atoms to appear displaced by as much as 0.8 angstrom from their actual positions. The hologram or interference data is operated on by a function representing a reconstructing wave to generate data corresponding to reconstructed amplitudes of the phase shift corrected waveform. Data corresponding to an integral of the reconstructed waveform is generated which is capable of being displayed as a three dimensional image of the atomic neighbors (scatterers) of the source atom (emitter). In a preferred embodiment particularly applicable to forward-scattering geometries, the data for imaging each scatterer atom is confined to a window (hemispherical section) nearest each atom, and the process is repeated at several different predetermined emitted electron energies in order to obtain better accuracy and image resolution. For backward scattering, the step of using a narrow window is omitted. In either case, the atomic image intensity at each energy is combined to form a composite atomic image intensity signal of high quality spacial resolution and eliminate distortions due to multiple scattering.

In accordance with another embodiment of the present invention, an apparatus for the reconstruction of a holographic image of atoms near the surface of a sample includes a device for generating a beam which causes the sample to emit localized electrons, a detector for detecting the intensity distribution of the resulting diffraction pattern, a device responsive to the intensity distribution for generating a signal corresponding to the intensity distribution, means such as computer software loaded in a computer for transforming the signal into data, normalizing the data, correcting it for the phase shift error, and performing other manipulations described in detail below to sharpen the resulting image. The computer, in conjunction with a video display or other output device, can then generate a signal representing a reconstructed amplitude of a waveform capable of being converted into a three-dimensional image of the atomic environment of atoms near the surface of the sample.

BRIEF DESCRIPTION OF THE DRAWINGS

The invention will be further described with reference to the accompanying drawings, wherein:

In FIGS. 3A-3C, a "B" designates a bright spot and an "L" designates a diffuse light spot, with the remaining area being dark.

DETAILED DESCRIPTION OF THE PREFERRED EMBODIMENTS

The present invention involves determining the relative positions of atoms near the surface of a sample from data obtained using diffraction patterns formed from localized electron sources. In forming 3-dimensional images of atoms from electron diffraction patterns from localized sources, there are two important goals: (i) that the images be formed at the correct atomic positions, and (ii) that the resolution be as good as possible. In physical terms, resolution is determined by the full-width-at-half-magnitude (FWHM) of the image intensity.

The present invention includes a phase-shift correction that allows 3-D images to be formed at the correct positions. Results on the system Si(111) $c3 \times c3$ R30° —B discussed below show that the images are formed less than 0.05 Å away from the correct atomic positions. Additionally, to obtain a desirable spatial resolution in the direction of the emitter-scatterer, images formed from diffraction data taken at different emission energies are combined to form a composite image.

The method of the invention involves recording and normalizing a diffraction pattern. The normalized diffraction pattern is operated on by a phase shift correction function to eliminate error due to the phase shift in the collected data, and the corrected diffraction pattern is treated as a hologram. Holographic image intensity data are generated from the hologram by a system which mimics the physical steps ordinarily necessary to create an actual image of the hologram. Selected planes of the generated image may be viewed by displaying data corresponding to a single plane on a television monitor or similar device. Alternatively, perspective views of the three-dimensional image may be generated and displayed.

Localized source electrons are incoherent electrons emanating from a sample. The localized source electrons may be formed in a number of well known ways. For example, X-rays directed onto the surface of a sample will cause photoelectrons to be emitted. Alternatively, electrons that are directed to a sample and undergo an inelastic collision lose their phase information and become incoherent Kikuchi electrons, another type of localized source electrons. Localized source electrons also include Auger electrons emitted by atoms within a sample when incident electrons strike atoms within the sample. The invention described herein applies to all localized source electrons, and is not limited to the examples of localized source electrons given above. As will be explained below, even though the different localized source electrons are incoherent, the diffraction pattern formed contains holographic data.

The preferred exemplary embodiment is shown in connection with a diffraction pattern formed by photoelectrons. However, as one skilled in the art will readily recognize, the techniques and apparatus described herein are equally applicable to any localized source electrons.

Figure 1:
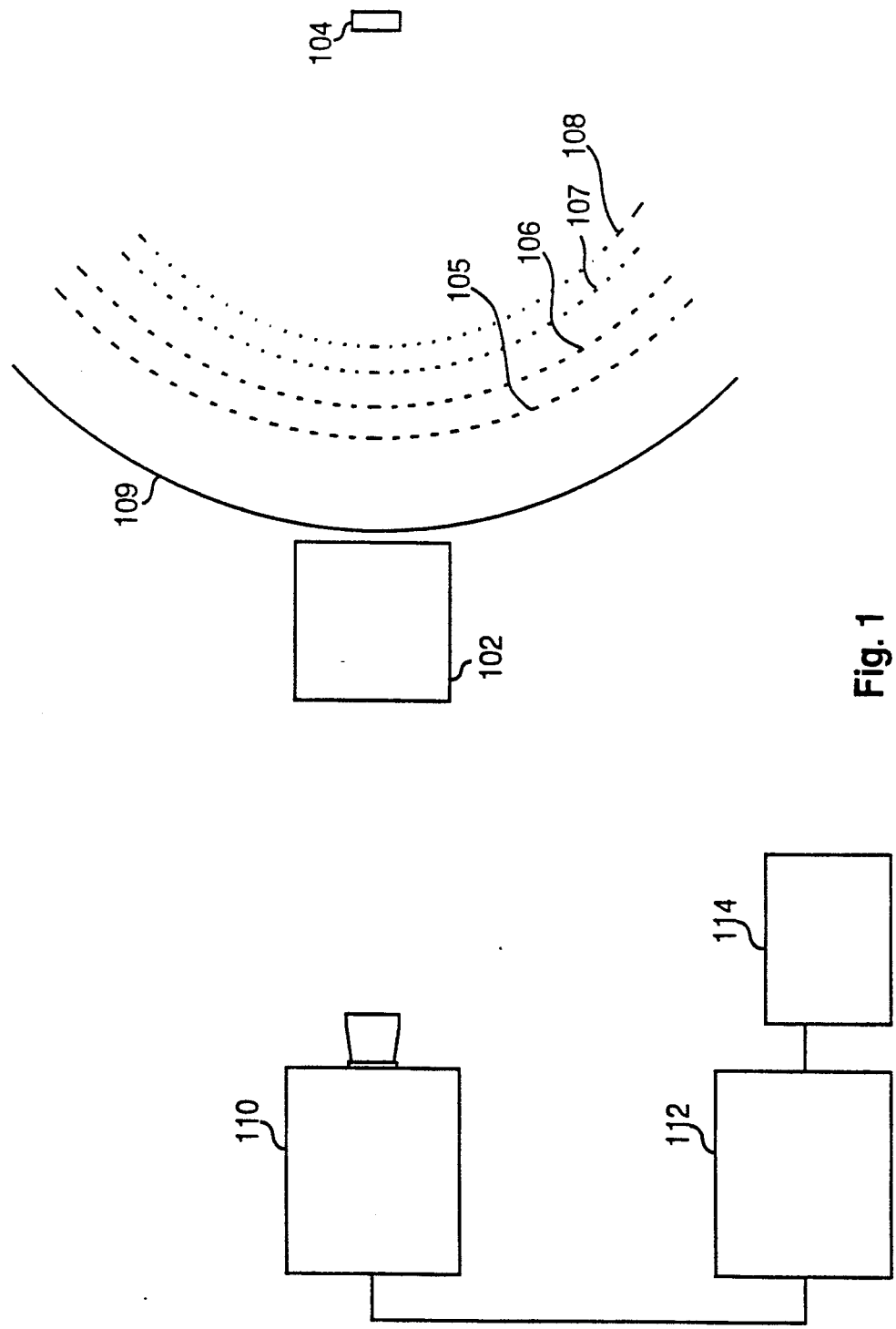
FIG. 1 is a schematic diagram of an apparatus for determining the surface structure of a sample using photoelectron diffraction data according to the present invention.

The apparatus used for generating and collecting photoelectron diffraction data in the present invention is similar to equipment employed in conventional electron diffraction techniques used for gathering information about the surface structure of a sample. As shown in FIG. 1, such an apparatus according to the invention includes an X-ray source 102 for directing X-rays to a sample 104, an energy filter, comprised of grids 105-108, a detector 109 for detecting the intensity of scattered electrons, a camera 110 for converting the intensity of the diffraction pattern of the electrons detected by detector 109 into electronic data, a computer 112 having suitable means, such as software, for storing and manipulating the data in accordance with the equations provided below, and a video display unit 114 for displaying a section of a selected plane of the resultant holographic image as the measurement is being conducted. As in conventional electron diffraction techniques, the data must be gathered in a vacuum.

For purposes of later creating a holographic image, X-rays generated by X-ray source 102, which are incident the surface of sample 104, should be of the appropriate energy and sufficiently monochromatic to cause atoms within the sample to emit photoelectrons. The X-rays may be collimated to be unidirectional in the preferred embodiment, although this is not critical. Various types of X-ray sources 102 are well known in the art, such as magnesium lamps having an energy of 1253 eV, an aluminum lamp having an energy of 1486 eV, or a synchrotron having a tunable energy. Source 102 provides an X-ray beam having the appropriate energy to cause photoelectrons to be emitted by atoms within sample 104. Similarly, an electron beam may be directed to the surface to create Auger or Kikuchi electrons, or a diffuse LEED diffraction pattern. Other sources of localized electrons may also be used.

The photoelectrons originating from the localized source are diffracted by the atoms near the surface of the sample and filtered by grids 105-108 to form an interference pattern at detector 109. Grids 105-108 are known in the art and are used to filter out electrons having energies outside of a predetermined range of energies. Grids 105-108 may thus be used to prevent electrons which do not contain holographic information from reaching detector 109. One such well known filter is the 4-grid LEED optics Varian model 981-0127.

The interference pattern (the hologram) formed at detector 109 is converted into electronic data by camera 110. When the electrons strike detector 109, which may, for example, be spherical in shape, detector 109 emits light at the locations electrons impinge upon detector 109 of an intensity proportional to the number of electrons impinging at each location. Camera 110 converts the intensity pattern of the light emitted by detector 109 into a signal. Computer 112 receives the signal and converts it to electronic data. Computer 112 is suitably programmed to store and mathematically manipulate the data which corresponds to the interference pattern intensity.

Figure 2:
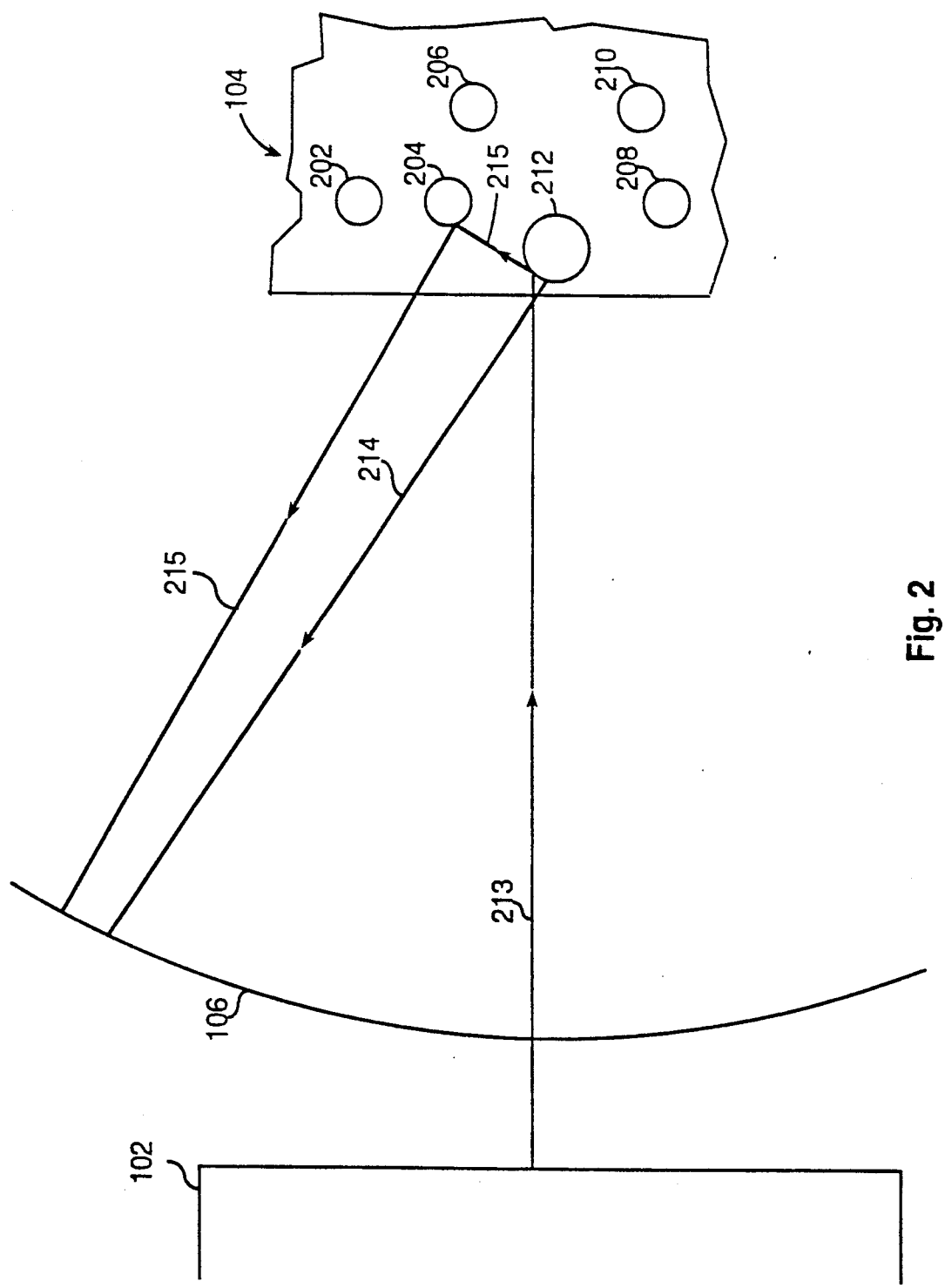
FIG. 2 shows representative paths of incident X-rays and photoelectrons emitted by atoms within a sample.

Referring to FIG. 2, the surface of sample 104 is shown enlarged relative to X-ray source 102. Surface 104 is comprised of surface atoms, representatively shown by 202, 204, 206, 208 and 210, and an emitter atom 212. Sample 104 has short range order, but not long range order. Long range order requires that each localized electron source (the atoms that emit electrons) be found at regular positions throughout sample 104. Short range order means that each localized electron source is surrounded by atoms in identical relative positions. While the structure shown in FIG. 2 has short range order only, the method and apparatus of the present invention allows the imaging of other types of structures, including structures having both long and short range order, or even substances lacking order.

X-rays travel from X-ray source 102 to sample 104 and impinge upon atoms near the surface of sample 104. In FIG. 2, the X-rays follow path 213 and impinge upon atom 212, causing a photoelectron to be emitted. An emitted photoelectron follows one of a plurality of paths, represented by 214 and 215. Electrons following path 214 travel directly from atom 212 (the emitter) to the detector and form the reference wave. Electrons following path 215 travel from atom 212 to nearby atom 204, where the electron is scattered and travels to detector 106, forming the object wave. Atom 212, which emitted the photoelectron, is the localized source for both the reference wave and the object wave photoelectrons.

An interference pattern is thus formed between the reference and object waves by photoelectrons originating from atom 212. The interference pattern contains holographic information regarding the environment of atom 212. If the emitter atom 212 is closer to the detector than the nearby scattering atoms, the geometry is called back-scattering. If the emitting atom 212 is in an atomic plane parallel to the surface below the plane of the nearby scattering atoms, the geometry is called forward-scattering. FIG. 2 shows an example of back-scattering geometry; however, the invention applies to both forward- and back-scattering geometries.

In practice, the interference pattern measured is actually the sum of large numbers interference patterns, each formed by a different localized source (i.e., a different emitter atom). Because short range order exists for the atoms adjacent the localized source, the wavelets that emerge from each localized source and its surrounding atoms are identical to the wavelets that emerge from the other localized sources and their surrounding atoms, except as to the difference in location. Thus, the emitting atoms behave like a collection of incoherent scatterers, and the resulting photoelectron diffraction pattern is the same as that from a single localized source, except for a uniform scaling factor. This is equally true for Auger electrons or any other type of localized source electron. The superposition of many incoherent localized source electrons may be interpreted as if the electrons were from a single source.

The data thus collected includes a phase shift error due to the difference in the direction of electrons travelling from the localized source directly to the detector, and the direction of electrons travelling from the localized source, scattering off a nearby atom, and then travelling to the detector. This distance distortion arises due to scattering, i.e., the effect of the nearby scattering atom on the scattered electron. The phase shift error in the object wave causes the image of the objects (i.e. the atoms surrounding a source of localized electrons) to be shifted from the actual location by up to one angstrom.

In accordance with the present invention, the true location of atoms surrounding a source of localized electrons can be determined by normalizing the measured intensity data, and then phase-correcting the normalized data. The phase-corrected normalized data is a hologram or interference pattern containing information relating to the actual location of observed atoms. The hologram or interference pattern is reconstructed as discussed below to produce an image of the source and surrounding atoms.

The normalization of the data may be performed by an appropriate function, such as by subtracting from each data point the average intensity (taken over the entire hemisphere) and then dividing by the average intensity. The normalized data is called $\chi(k)$. After the data is normalized, a phase-shift correction interference function dependent on the polar angle of the location of the atom being observed is applied. In order to determine the correction factor for a given observed atom, the angular polar coordinate for the given atom must be determined. Once the polar angle is determined the correction function may be readily determined.

In the forward-scattering geometry, the polar angle of an observed atom may be determined by analysis of the normalized diffraction data. An observed atom may be described as being located at a polar angle relative to the source. Each observed atom will cause an intensity peak in measured diffraction pattern data at a polar angle (relative to the center of the detected hemisphere) equal to the polar angle of the location of the observed atom. This peak is called a focusing peak, and the polar angle direction is called the focusing direction. The intensity peaks may easily be determined using a personal computer or other microprocessor, or by direct observation. Thus, by determining the polar angle of the intensity peaks of the measured diffraction pattern, the polar angle $\theta$ of the location of each observed atom may be determined.

Figure 3C:
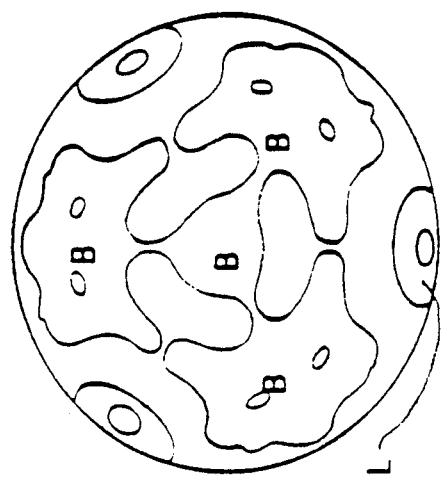
FIG. 3C is a diagram showing phase shift corrected diffraction data, i.e., a hologram.
Figure 3B:
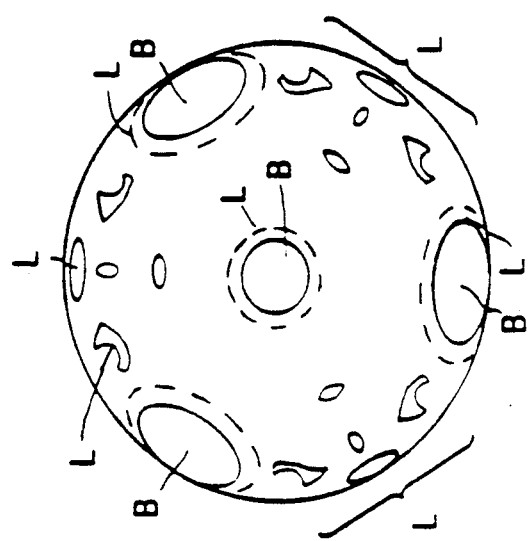
FIG. 3B is a diagram showing simulated measured diffraction data.
Figure 4:
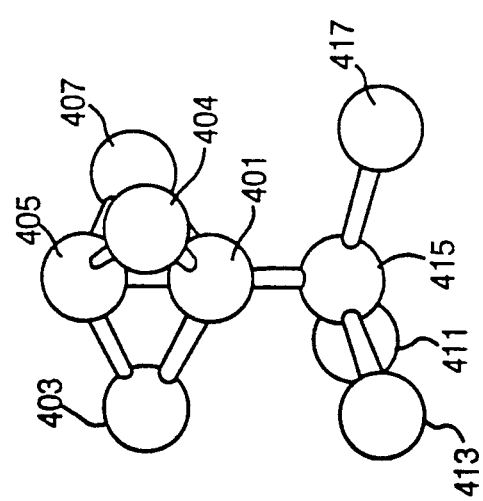
FIG. 4 is a representation of the surface structure which was used to produce the photographs of FIG. 3.

For example, referring to FIG. 3B, a two dimensional photoelectron diffraction pattern for Si(111) $\sqrt{3} \times \sqrt{3}$ R30° −B sample having a boron atom occupying a substitutional site (i.e. the $B_5$ site) in the second layer is shown. The structure of the sample is shown in FIG. 4, where the boron atom is 401, and the silicon atoms are 403–417. As may be readily determined from the three-dimensional measured and normalized data, three observed Si atoms 403, 404 and 407 are located at a polar angle of 63 degrees from the source boron atom 401, and one observed Si atom 405 lies at a polar angle of zero degrees from source atom 401 (i.e., directly above source atom 401).

After calculating the function for a particular angle, the measured and normalized data is divided, point by point, over the entire detected hemisphere by the value of the correction function at each point. Thus, corrected data over the entire hemisphere is provided for a given polar angle, that is, phase shift corrected, and contains holographic information regarding the location of atoms lying on the given polar angle. This interference data is reconstructed to determine the location (distance from the source and azimuthal angle) of the atom or atoms lying at the given polar angle.

A similar correction function is determined for each polar angle at which an atom lies as determined by analyzing the diffraction data. After determining a correction function for a polar angle, the measured and normalized data is corrected over the entire hemisphere and an image is reconstructed. By repeating the procedure for each polar angle at which the measured data has an intensity peak, the location of all atoms surrounding a source atom may be determined. For a structure such as the one shown in FIG. 4, only two correction functions need be formed, one for the atoms at a polar angle of 63 degrees and one for the atom at zero degrees. Of course, other structures may not be symmetrical and will require a function to be formed for each observed atom.

Turning now to the correction formula to correct for the phase shift, a correction function of the form:

$$P_i(\hat{k}) = a_i \sum_j |f(k \triangleq R_j)| \qquad (1)$$

is used for atom (i) where $a_i$ is the phase given by $$\frac{f(k \triangleq R_j)}{|f(k \triangleq R_j)|},$$

$R_j$ is the focusing direction for atom i determined from the k-space diffraction pattern, j is the summation index normally including all the focusing directions, and $\Sigma$ is a summation function of the form:

$$\{f(k \triangleq R_1)| + |f(k \triangleq R_2)| + \ldots \qquad (2)$$

The function $f(k \triangleq R_j)$ is the complex scattering factor given by:

$$f(k \triangleq R_j) = f(\theta) = \frac{1}{2ik} \sum_l (2l + 1) P_l(\cos\theta)(e^{2i\delta_l} - 1) \qquad (3)$$

where $\bar{k}$ is the wave vector of the outgoing electron, $P_l(\cos\theta)$ is the Legendre polynomial, l is a summation index, and $\delta_l$ is the phase shift. Note that $f(k \triangleq R_j)$ is complex. Its absolute value and phase can be calculated accurately by the software program set forth below.

Figure 3A:
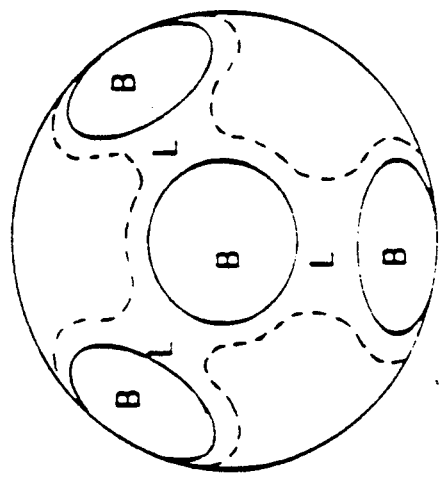
FIG. 3A is a diagram created by data generated by a phase shift correction function.

In FIG. 3A, the absolute value of the phase shift correction function $P_i(\hat{k})$ for an atom at a polar angle of 63 degrees is shown. This is the correction function or "mask" used to phase correct the normalized data for the observed atoms at a polar angle of 63 degrees. When the normalized data, shown in FIG. 3B, is divided point by point by the correction function $P_i(\hat{k})$, a new quotient function given by:

$$G_i(\hat{k}) = \frac{\chi(\hat{k})}{P_i(\hat{k})} \qquad (4)$$

is obtained. This new quotient function is the phase-corrected hologram. Its absolute value is shown in FIG. 3C. In Eq. 1, the sum over j does not have to include all the focusing directions. However, for best results, e.g., to reduce noise, complete sets of focusing directions that are related by the symmetry of the surface structure should be included.

After obtaining the phase shift corrected data which is a hologram of the observed atom, the data can be inverted by 3-dimensional Fourier transformation as defined in Eq. 5 below to form the atomic image. The integration may be performed numerically on a computer or other processors using a fast Fourier transform, such as the one taught in *Numerical Recipes*, William Press et. al., Cambridge Press (1986). The fast Fourier transformation is carried out on the corrected data to produce an image at the correct atomic position.

Figure 5:
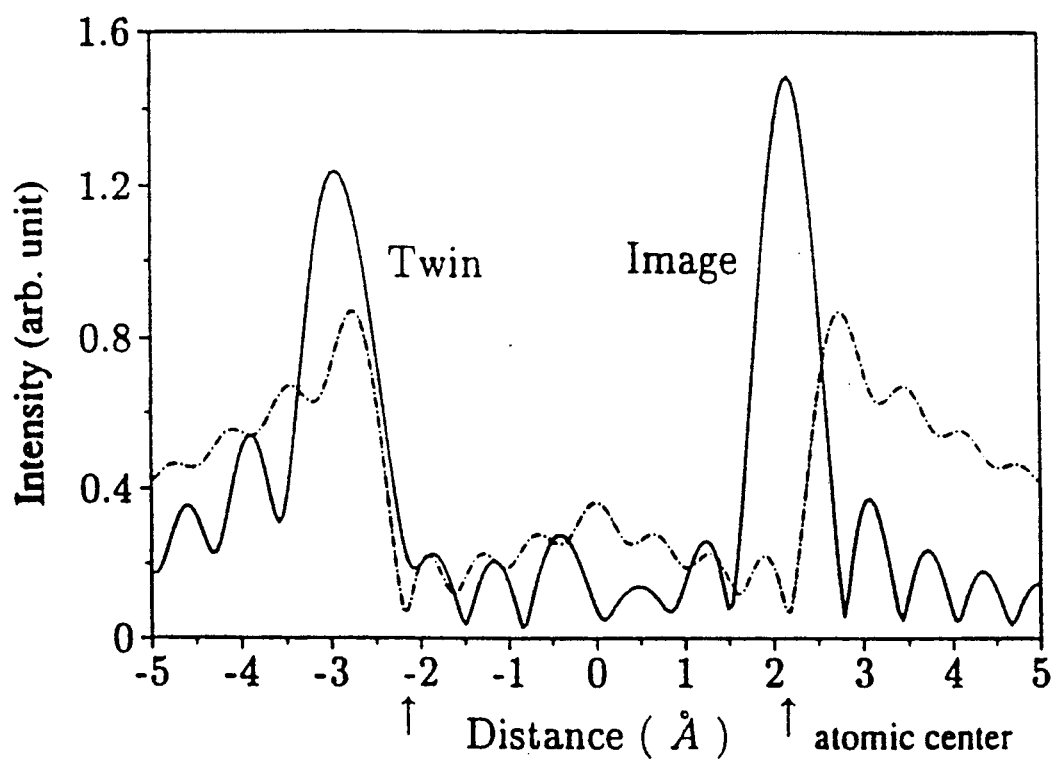
FIG. 5 is a graph of relative intensity versus distance in Angstroms for a phase-corrected image at positive distance and its twin at negative distance, according to the invention (solid line) and an uncorrected image (broken line), image at positive distance, twin at negative distance. Arrows indicate the positions of atomic centers of the image and its twin.

FIG. 5 illustrates the advantages of the invention. In FIG. 5, intensity of the reconstructed image is plotted as a function of distance from the source atom for a given angular direction. The atomic center of the image is located at the maximum peak intensity, and the resolution is a function of peak half-width. The solid line, generated according to the invention, has an atomic center close to the actual atomic center (shown by an arrow, in positive distance.) Without the phase correction process of the invention, the maximum peak intensity is shifted 0.8 angstrom away from the correct atomic position (chained line, positive distance). The peaks in negative distance are twins created as part of the image reconstruction, and can be ignored.

As noted above, FIG. 4 represents a Si(111) $\sqrt{3} \times \sqrt{3}$ R30° −B sample. In accordance with a preferred embodiment of the invention, the atomic image is reconstructed from a simulated, forward-scattering X-ray photoelectron source at photoelectron energies of 300–2,000 eV. Photoelectrons at energies above 300 eV are strongly scattered in the forward direction by the core potentials of atoms. Intensity enhancement is strongest in the emitter-scatterer direction (the focusing effect), causing an intensity peak to appear at the polar angle of the scatterer atom. In an angular cone surrounding each forward-focusing direction, the interference pattern is used to form 3-dimensional images of atoms in the layer or layers above the emitter (source).

The photoemission diffraction patterns are obtained by holding the photon incident direction and the electron exit angle fixed while the crystal is rotated to generate the $2\pi$ hemispherical scan. As one skilled in the art will recognize, the crystal may remain stationary and the point of detection may be scanned. The $2\pi$ steradian diffraction patterns are converted to produce 3-dimensional real space images $\phi(x,y,z)$ which may be viewed in different planar sections.

While the above method and apparatus provides an image in the correct location, the resolution may be further improved. With forward-scattering geometry, a limiting factor in the image resolution is the data range available in $\bar{k}$-space for image reconstruction. At high energies, the intensity of scattered electrons falls off rapidly as the scattering angle measured from the emitter-scatterer internuclear direction increases. This limits the usable range of $\Delta\bar{k}_{\parallel}$ and $\Delta\bar{k}_z$ in the transform, especially when other focusing directions are nearby. Since the diffraction limit for the resolution is $$\Delta r_\alpha = \frac{2\pi}{\Delta k_\alpha}$$

where $\alpha$ is a Cartesian coordinate index, the finite range of available $\Delta\bar{k}$ limits the achievable spatial resolution.

In this invention this serious limitation is overcome through an energy extension method in which diffraction data and image intensity distributions taken at different photoelectron energies are combined to form a composite image intensity distribution to extend the effective range for 3-dimensional image reconstruction. In the following example, the coordinate system is such that the emitter-scatterer internuclear direction is the z-axis. Application of the method to other focusing directions can be achieved by a simple polar angle rotation.

For the purpose of image reconstruction, one preferred mode of collecting diffraction data by X-ray photoelectron spectroscopy is to rotate the crystal while keeping the directions of photon incidence and electron exit fixed. This collection mode eliminates the anisotropy in the measured unscattered wave for any initial core level. An image reconstruction method based on 3-dimensional Fourier transformation is used:

$$\phi(\vec{R}) = |\int \chi(\vec{k})\delta(k-k_o)e^{i\vec{k}\cdot\vec{R}}d^3k| \quad (5)$$

where $\chi(\vec{k})\delta(k-k_o) = (I(\vec{k})\delta(k-k_o) - A)/A$. Here, $I(\vec{k})\delta(k-k_o)$ is a measured or calculated XPS intensity at $k=k_o$, A is the angle-averaged value of the intensity and $k_o=$ $$k_o = \sqrt{\frac{2m}{\hbar^2} E}$$

is the photoelectron's wave vector. Integrating out the $\delta$-function and putting $k_o^2 d\Omega = d\bar{k}_{\parallel}/\cos\theta$, we obtain $$\phi(\vec{R}) = \left| \int \frac{\chi(\hat{k}_o k) e^{ik_o\hat{k}\cdot\vec{R}}}{\cos\theta} dk_x dk_y \right| \quad (6)$$

To form the image at the correct atomic position the phase shift of the forward scattering factor is first removed by dividing $\chi(k_o\hat{k})$ with a correction function $P_i(k_o\hat{k})$ to obtain a new quotient function $G_i(k_o\hat{k})$ $=\chi(k_o\hat{k})_i/P_i(k_o\hat{k})$. Here, i is the image reconstruction for the $i^{th}$ atom.

If, in a given system, the usable angular range for image reconstruction of a particular atom is $\Omega_c = (\phi_c; \phi_c = 2\pi)$, since $\Delta\bar{k}_{\parallel} = 2k_o \sin\theta_c$ and $\Delta k_z = k_o(1-\cos\theta_c)$, the limit of spatial resolution is given by $$\Delta\vec{r}_{\parallel} = \frac{2\pi}{k_o \sin\theta_c} \text{ and } \Delta z = \frac{2\pi}{k_o(1-\cos\theta_c)}.$$

For a 1,000 eV photoelectron with a usable $\bar{k}$-space range of $\theta_c = 45°$, $\phi_c = 2\pi$, we obtain $\Delta\vec{r}_{\parallel} = 0.27$ Å and $\Delta z = 1.32$ Å respectively. The images are thus elongated towards the origin (the emitter) with particularly poor resolution along the emitter-scatterer direction. The process of the invention improves the resolution in this direction.

To extend the $\bar{k}$-space range, the image intensities and the available k ranges at different energies are combined to form a composite image intensity distribution. Thus, the image of the $i^{th}$ atom, from combining together N energy intervals, is given by:

$$\phi_i(R_o,\vec{R}) = \left| \sum_{n=1}^{N} \int_{\Omega_o} \frac{G_i(k_n\hat{k}) e^{-ik_n R_o} e^{ik_n\hat{k}\cdot\vec{R}}}{\cos\theta} dk_x dk_y \right|$$

where $k_A=$ $$k_n = \sqrt{\frac{2m}{\hbar^2} E_n}$$

and the integral is over the solid angle $\Omega_c$. The position of the image, $R_o$, appears in Eq. (7).

Figure 6:
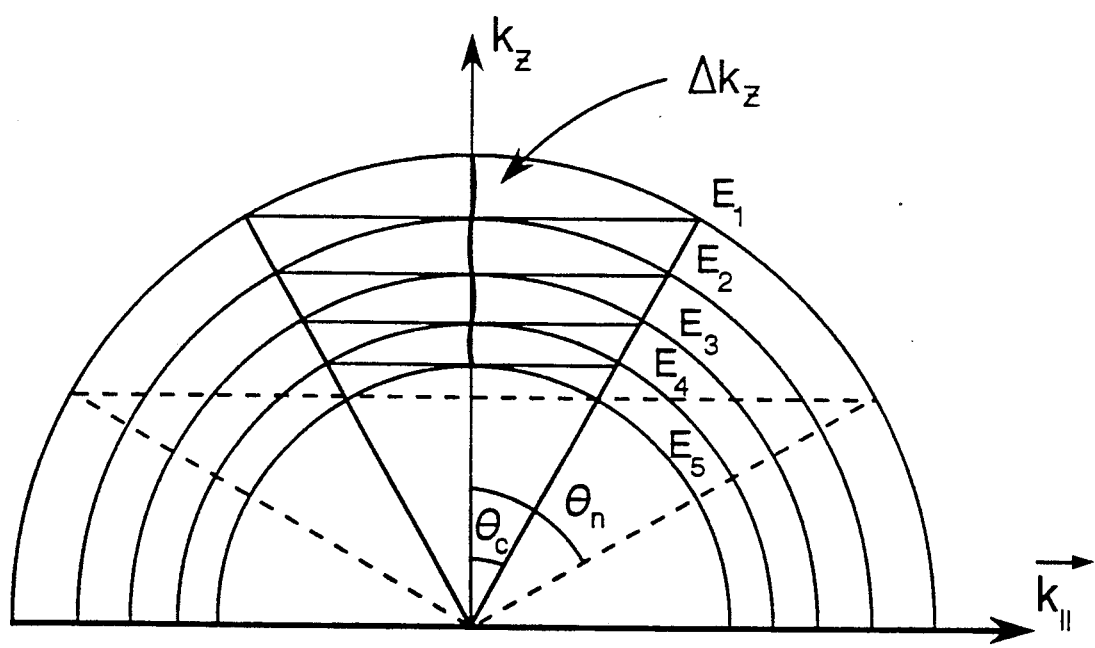
FIG. 6 is a schematic diagram showing the angular range of useful diffraction data and the effective range after energy extension given by the present invention for a given emitter atom.

$R_o$ must be determined and then its value input into Eq. (7). The equation is then solved to a self-consistent convergence. It is also important that the energies are chosen such that the range of $\Delta\bar{k}$ in the emitter-scatterer direction (i.e., $\Delta k_z$ in this case) is continuous. The continuity of $\Delta k_z$ is guaranteed if each energy is chosen by the formula:

$$E_n = E_1 \cos^{2n-2}\theta_c \quad (8)$$

where $E_1$ is the starting (largest) energy and $\theta_c$ is the polar angle of the available k-range, as shown schematically in FIG. 6. The effective range after joining together n intervals of $\theta_c$ is:

$$\theta_n = \cos^{-1}(\cos^n\theta_c) \quad (9)$$

As one skilled in the art will recognize, the foregoing equations can be solved using a computer program similar to the one referred to above.

Figure 7:
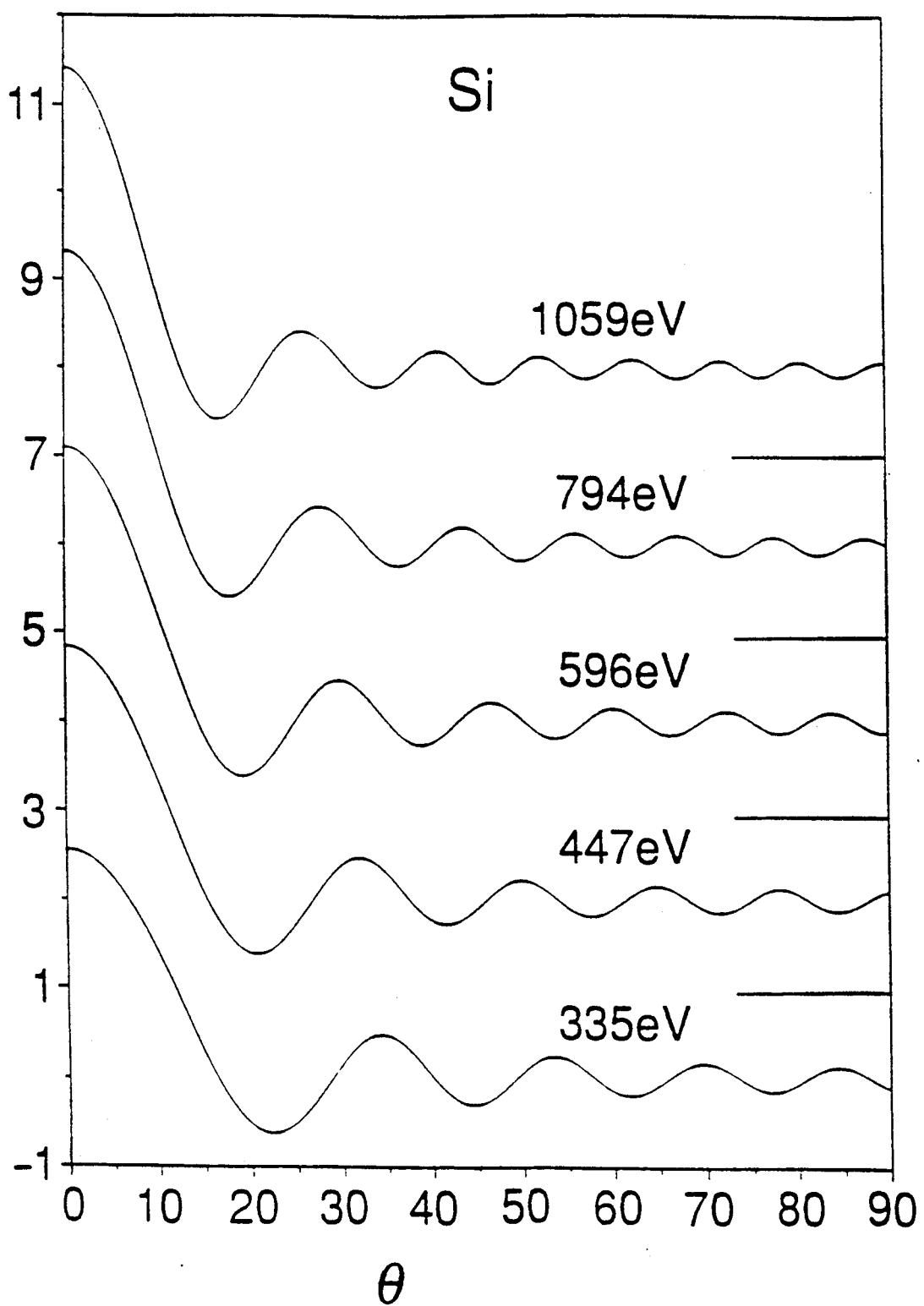
FIG. 7 is a graph of normalized intensity versus polar angle for various emitted electron energies.

This method is illustrated for a specific example of a diatomic system consisting of an emitter located at $z = -2.35$ Å and a scatterer at the origin. Both emitter and scatterer are Si atoms. The starting energy is selected as 1059 eV and $\theta_c = 30°$ is the polar angle of the available k-range at each energy. The calculated diffraction data $\omega_n(\theta)$ is joined together at five predetermined energies, which from Eq. (8) are 1059 eV, 795.9 eV, 597 eV, 448 eV and 335 eV, respectively. The five $\chi_n(\theta)$ or modified interference data are shown in FIG. 7, each having its own period.

Figure 8:
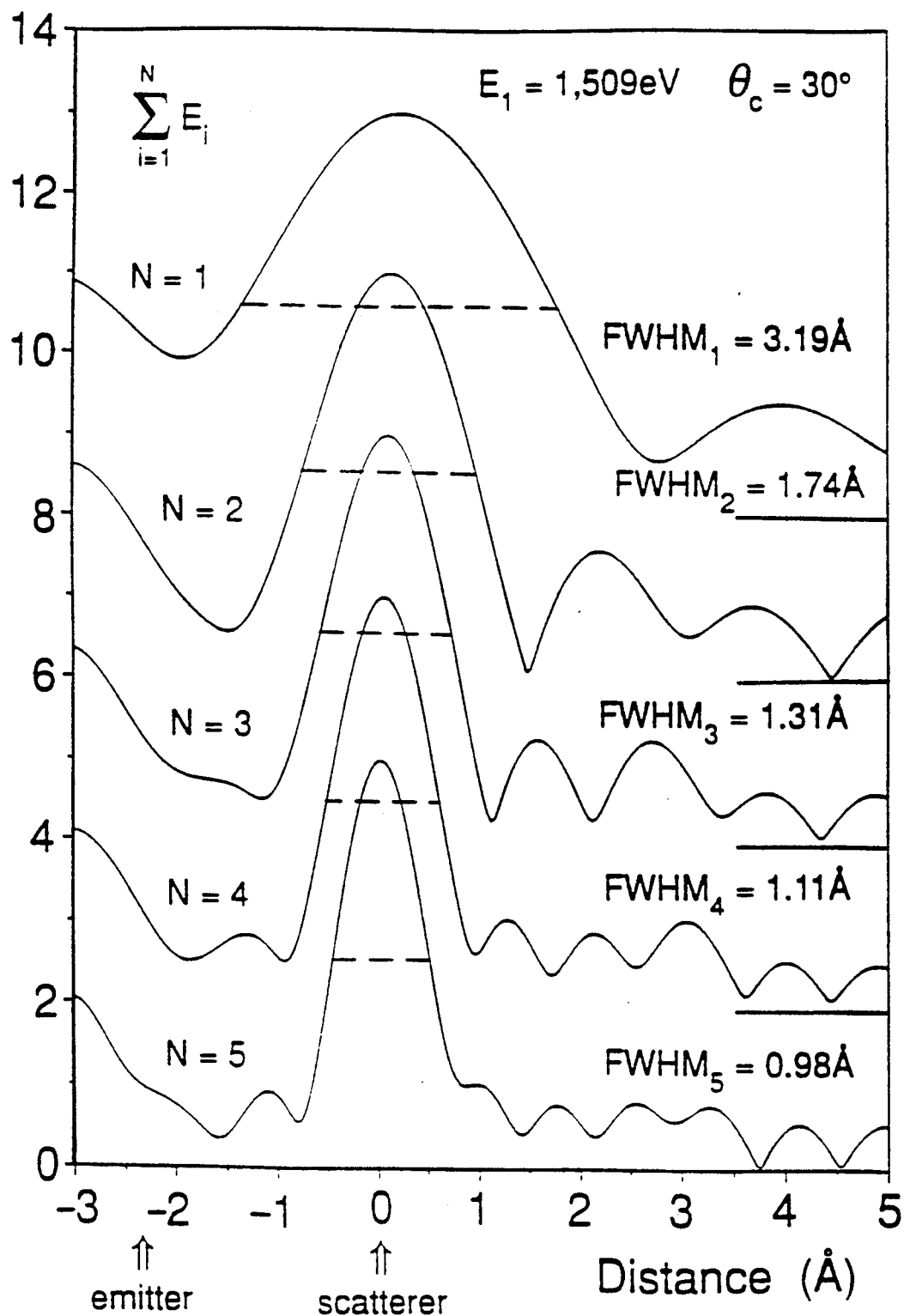
FIG. 8 is a graph of a composite image intensity versus distance for combining data from various numbers of emitted electron energies.

For the diatomic example described, (A) equals the emission intensity of an isolated atom. Equation (7) is applied to form the composite image intensity distribution and successively extend the k-range. The results are shown in FIG. 8. With successive k-range extensions, FIG. 8 shows that the full-width-at-half-magnitude (FWHM) of the image decreases dramatically from 3.19 Å (top curve, single-energy), to 1.74 Å (second curve, two energies), etc., ultimately down to 0.98 Å (bottom curve, five energies). The effective extended range (from Eq. (9)) is $\theta_n = 60.8°$, which with $E_1 = 1059.5$ eV yields a diffraction limit of 0.73 Å. This is indeed very close to the FWHM of the imaging for combining five $\chi_n(\theta)$ together, thus indicating that the method is working near the ideal limit. By extending the number of energy intervals to be joined together, we can reach spatial resolution in $\Delta_z$ of any desired value.

To find $R_o$ to input in Eq. (7), trial values $R_i$ are used to search for the maximum value of $\phi_i(R_i,\bar{R})$, which occurs when $R_i = R_o$ and $\bar{R} = \bar{R}_o$. This energy extension method eliminates noise due to multiple scattering effects in both the forward and back scattering geometries. In the forward scattering geometry, the best results are obtained by using a small angular window around each focusing direction for image reconstruction. Within the window the diffraction data is due to atoms in a specific direction and, by joining together data taken at different energies in the same small window, an extended angular range of exclusive diffraction data due to atoms in that specific direction is obtained. The image from reconstruction of such data is sharp (i.e., high quality resolution is obtained) and noise is low. This can be described as a small-window energy-extension process (SWEEP).

In back-scattering geometry, because the directional information of $\bar{R}_o$ is unknown, Eq. (7) is used to first find the maximum value of $\phi_i(R_i,\bar{R}_i)$ which occurs when $\bar{R}_i = \bar{R}_o$. For back-scattering geometry, the normalized diffraction data $\phi(k_n\hat{K})$ is used in Eq. (7) instead of the phase-shift corrected function $G_i(k_n\hat{k})$. After $\bar{R}_o$ is determined in both magnitude and direction, the phase-shift correction process described in this invention is applied to the back-scattering diffraction data as described above. The energy-extension process is applied again to the phase-shift corrected data until proper consistency is obtained. For back-scattering geometry, a wide angular window is used because the diffraction data is not confined to the region nearest the focusing direction.

To summarize, the method of the invention varies for forward-scattering and back-scattering geometries. For forward-scattering geometry, diffraction data from a localized source is gathered at a single electron energy, using a full hemispheric angular window. The normalized data is $\chi(\hat{k})$. $\chi(\hat{k})$ contains bright spots corresponding to emitter-scatterer directions (these directions are called focusing directions). For a given focusing direction, i, a phase-shift correction function is generated for this particular direction, $P_i(\hat{k})$. $\chi(\hat{k})$ is divided by $P_i(\hat{k})$. The quotient, denoted by $G_i(\hat{k})$, is the phase-shift corrected function Three-dimensional Fourier transformation is performed on the phase-shift corrected function $G_i(\hat{k})$. This yields three-dimensional images of an atom or a chain of atoms at a distance or distances relative to the emitter in the direction i. Because of the phase-shift correction, the images are formed at the correct positions except in cases of strong multiple scattering (see below). However, the resolution of the image may be poor. The foregoing steps are repeated for each focusing direction in turn. The result is a three-dimensional reconstruction of all nearby atoms from the emitter, correctly located in space. In the forward-scattering geometry, only nearby atoms in plans above the emitter atom are imaged. To image nearby atoms in planes below the emitter, the method for back-scattering geometry is used.

The use of the SWEEP process according to the invention can reduce or eliminate the foregoing problems with resolution and multiple scattering effects. For forward-scattering geometry, the normalized data $\chi(\hat{k})$ is gathered for a number of electron energies. The optimal energies are given by Eq. (8), although other energies may be substituted; noise will increase if the optimal energies are not used. Typically, 5-10 different energies are enough. Instead of using the full hemispheric angular range for reconstruction, a small angular cone defined by $\theta_c$ is selected. Only the data inside this cone is used. The cone is centered around a forward-focusing direction i, and the angle is generally in the range of 30 to 60 degrees, depending on the number of scatterers. The phase-shift corrected functions $G_i(\hat{k})$ are generated, as before, for each electron energy. Eq. (7) is used to form $\phi_i(R_o,\bar{R})$. This equation joins together the $G_i(\hat{k})$ of each electron energy. In order to use Eq. (7), $R_o$, the distance of the scatterer from the emitter, must be known. To find $R_o$, trial values $R_i$ are used in Eq. (7), and the maximum value determined for $\phi_i(R_i,\bar{R}_i)$ is used to determine $R_o$. With the correct $R_o$ in Eq. (7), the function $\phi_i(R_i,\bar{R})$ yields a three-dimensional image of a nearby atom. This image has all the desired qualities, namely (1) low noise, (2) high-quality resolution (less than 0.05 angstrom resolution is achievable by using 5 or more energies), and (3) the image forms at the correct position even in strong multiple scattering cases, e.g., an emitter embedded in the third or fourth atomic layer below a surface.

For back-scattering geometry, the procedure is as follows. Normalized data $\chi(\hat{k})$ is gathered for a number of electron energies using a full hemispheric window. The preferred energy range is between 100-400 eV. Back-scattering is more isotropic, such that forward-focusing directions are absent. This means the angular directions of nearby scatterers need to be found first. Eq. (7) is used as before, except that the phase-shift uncorrected functions $\chi(\hat{k})$ are used instead of the corrected functions $G_i(\hat{k})$. Trial values $R_i$ are used to search for the maximum of $\phi_i(R_i,\bar{R}_i)$. From the maximum, the distance as well as the direction of the scatterer is derived to a first-order approximation. The direction of the scatterer is then used to make the phase-shift correction. The phase corrected functions $G_i(\hat{k})$ at different energies are now used in Eq. (7), with trial values of $R_i$. The new maximum of $\phi_i(R_i,\bar{R}_i)$ gives the second iteration value of $R_o$ and its direction. Using this second-iteration value, Eq. (7) is used to determine $\phi_i(R_o,\bar{R})$, which is the three-dimensional image of the scatterer. This two-iteration image process overcomes the distortions caused by multiple scattering.

Accordingly, the present invention provides a method of three-dimensional atomic imaging and a new, lenseless electron microscope achieving a resolution of one angstrom or better, useful in systems exhibiting strong multiple scattering and capable of image location within 0.3 angstrom of atomic centers. While several embodiments of the invention have been described, it will be understood that it is capable of further modifications, and this application is intended to cover any variations, uses, or adaptations of the invention, following in general the principles of the invention and including such departures from the present disclosure as to come within knowledge or customary practice in the art to which the invention pertains, and as may be applied to the essential features set forth and falling within the scope of the invention or the limits of the appended claims.

The computer program listing referred to above is as follows:

| Fortran Program for Generating f(θ) |
|---|

```
       complex fthe(101),cz,ci
       dimension the(101)
       dimension x(101),phs(15)
       cz=(0.,0.)
       ci=(0.,1.)
       pi=acos(-1.)
       ee=500.0
       read(5,*) (phs(1),1=1,15)
       write(6,*) (phs(1),1=1,15)
       ek=sqrt(2.*ee/27.18)
c
c      fthe(j) is f(theta)
       do 50 j=1,101
  50   fthe(j)=cz
       fthmax=0.0
       fthmin=0.0
       do 777 j=1,101
       dthe=180./100
       the(j)=dthe*(j-1)*pi/180.
       x(j)=cos(the(j))
       do 770 l=1,15
       pl=plj((l-1).the(j))
       fthe(j)=fthe(j)+(2*l-1)*cexp(ci*phs(1))*sin(phs(1))
     + *pl/ek
 770   continue
       if(cabs(fthe(j)).le.1.0)fthe(j)=fthe(j)/cabs(fthe(j))
       if(cabs(fthe(j)).gt.fthmax)fthmax=cabs(fthe(j))
       if(cabs(fthe(j)).lt.fthmin)fthmin=cabs(fthe(j))
 777   continue
c
       write(80,71)ee
       do 70 j=1,101
       thej=the(j)*180./pi
       write(80,71)thej,fthe(j).cabs(fthe(j))
       write(81,71)thej.real(fthe(j))
       write(82,71)thej.aimag(fthe(j))
       write(83,71)thej.cabs(fthe(j))
  70   continue
c
  71   format(f8.2,4f10.3)
       stop
       end
ccccc
c      l=0,1,2,3, ... theta is in radian
       function plj(l,theta)
       if(l.eq.0)then
       plj=1.0
       return
       elseif(l.eq.1)then
       plj=cos(theta)
       return
       endif
       if(l.le.1) then
       write(6,*) ' error in plj(l,theta)'
       return
       endif
       x=cos(theta)
       p0=1.0
       p1=x
       do 10 i=2,l
       pl=((2*i-1)*x*pl-(i-1)*p0)/i
       p0=p1
       p1=pl
  10   continue
       plj=pl
       return
       end
```

I claim:

1. In a method for three-dimensional imaging of the atomic environment of a sample, including the steps of directing a beam against said surface to form a localized source electron diffraction interference pattern, detecting the intensity distribution of said pattern, calculating numerical image intensity data corresponding to said intensity distribution, and reconstructing the interference data to form a pattern indicating the location of a scatterer atom on said surface relative to an associated emitter atom on said surface, the improvement which comprises:

phase shift-correcting the data using a function $P_i(\hat{k})$ dependent on the polar angle between the emitter atom and a scatterer atom i.

2. A method for three-dimensional imaging of the atomic environment of a sample, comprising the steps of:
   (a) directing a beam against said surface to form a localized source electron diffraction interference pattern;
   (b) detecting the intensity distribution of said pattern;
   (c) calculating numerical image intensity data corresponding to said intensity distribution;
   (d) normalizing the intensity data;
   (e) phase shift-correcting the normalized data; and
   (f) reconstructing the corrected interference data to form an image indicating the location of a scatterer atom on said surface relative to an associated emitter atom on said surface.

3. The method of claim 2, wherein the sample is a crystal having short range order.

4. The method of claim 3, wherein said beam is an X-ray beam.

5. The method of claim 4, wherein said beam is an electron beam.

6. The method of claim 2, wherein step (e) further comprises determining the polar angle of the scatterer relative to the emitter, and dividing the data $\chi(\hat{k})$ by a function $P_i(\hat{k})$ dependent on the polar angle between the emitter atom and the scatterer atom (i).

7. The method of claim 6, further comprising repeating steps (e) and (f) for each different polar angle of each scatterer atom relative to the emitter atom.

8. The method of claim 2, wherein step (f) further comprises forming a holographic image of said atoms on said surface by multiplying the corrected data by a function corresponding to the amplitude distribution of a reconstructing coherent electron beam.

9. The method of claim 2, further comprising repeating steps (a)-(d) at several predetermined localized source electron energies, and step (f) further comprises combining data from each such repetition to form the image.

10. The method of claim 9, wherein the emitter and scatterer atoms have forward-scattering geometry, further comprising reconstructing the image of each scatterer atom using only diffraction data in an angular cone oriented in the forward-scattering focusing direction of each scatterer atom.

11. The method of claim 10, wherein said cone is described by an angle $\theta_c$.

12. An apparatus for three-dimensional imaging of the atomic environment of a sample, comprising:
   means for directing a beam against said surface to form a localized source electron diffraction interference pattern;
   means for detecting the intensity distribution of said pattern;
   means for calculating numerical image intensity data corresponding to said intensity distribution;

means for normalizing the intensity data;
means for phase shift-correcting the normalized data; and
means for reconstructing the corrected interference data to form an image indicating the location of a scatterer atom on said surface relative to an associated emitter atom on said surface.

13. The apparatus of claim 12, further comprising means for combining data generated at several predetermined localized source electron energies to form the image.

14. The apparatus of claim 12, further comprising means for reconstructing the image of each scatterer atom using only diffraction data in an angular cone oriented in the forward-scattering focusing direction of each scatterer atom.

* * * * *